(12) United States Patent
Kim

(10) Patent No.: US 7,811,902 B2
(45) Date of Patent: Oct. 12, 2010

(54) METHOD FOR MANUFACTURING NITRIDE BASED SINGLE CRYSTAL SUBSTRATE AND METHOD FOR MANUFACTURING NITRIDE BASED LIGHT EMITTING DIODE USING THE SAME

(75) Inventor: Dong Joon Kim, Seoul (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 0 days.

(21) Appl. No.: 12/328,165

(22) Filed: Dec. 4, 2008

(65) Prior Publication Data

US 2009/0087937 A1 Apr. 2, 2009

Related U.S. Application Data

(62) Division of application No. 11/214,685, filed on Aug. 30, 2005, now abandoned.

(30) Foreign Application Priority Data

Feb. 22, 2005 (KR) ........................ 10-2005-0014424

(51) Int. Cl.
    *H01L 21/30* (2006.01)
    *H01L 21/46* (2006.01)
(52) U.S. Cl. ................................ 438/458; 257/E21.099
(58) Field of Classification Search ................. 438/458; 257/E21.099
    See application file for complete search history.

(56) References Cited

U.S. PATENT DOCUMENTS

| 5,804,834 | A | 9/1998 | Shimoyama et al. |
| 5,985,687 | A | 11/1999 | Bowers et al. |
| 6,339,010 | B2 * | 1/2002 | Sameshima ................. 438/458 |
| 6,362,496 | B1 * | 3/2002 | Nanishi et al. ................ 257/94 |
| 7,071,047 | B1 * | 7/2006 | Furukawa et al. ........... 438/197 |
| 2004/0004245 | A1 | 1/2004 | Forbes et al. |
| 2004/0201030 | A1 | 10/2004 | Kryliouk et al. |

FOREIGN PATENT DOCUMENTS

| JP | 08255930 A | 10/1996 |
| JP | 10199815 A | 7/1998 |
| JP | 11145057 A | 5/1999 |
| JP | 2001-015442 A | 1/2001 |
| JP | 2003347231 A | 5/2003 |
| JP | 2004119807 A | 4/2004 |
| JP | 2004284831 A | 10/2004 |
| KR | 199933493 | 5/1999 |
| KR | 2001088930 A | 9/2001 |
| WO | 2005006420 A1 | 1/2005 |

\* cited by examiner

*Primary Examiner*—Matthew C Landau
*Assistant Examiner*—Daniel Luke
(74) *Attorney, Agent, or Firm*—Volpe and Koenig, P.C.

(57) ABSTRACT

A method for manufacturing a nitride based single crystal substrate and a method for manufacturing a nitride based light emitting diode using the same. The method for manufacturing the nitride based single crystal substrate includes forming a ZnO layer on a base substrate; forming a low-temperature nitride buffer layer on the ZnO layer using dimethyl hydragine (DMHy) as an N source; growing a nitride single crystal on the low-temperature nitride buffer layer; and separating the nitride single crystal from the base substrate by chemically eliminating the ZnO layer.

12 Claims, 4 Drawing Sheets

METHOD FOR MANUFACTURING NITRIDE BASED SINGLE CRYSTAL SUBSTRATE AND METHOD FOR MANUFACTURING NITRIDE BASED LIGHT EMITTING DIODE USING THE SAME

CROSS REFERENCE TO RELATED APPLICATIONS

This application is a division of U.S. patent application Ser. No. 11/214,685, filed Aug. 30, 2005, which is based on, and claims priority from, Korean Application Number 2005-0014424, filed Feb. 22, 2005, the disclosures of which are incorporated by reference herein in their entirety.

BACKGROUND OF THE INVENTION

1. Field of the Invention

The present invention relates to a method for manufacturing a nitride based single crystal substrate, and more particularly to a method for manufacturing a nitride based single crystal substrate using a ZnO layer and a method for manufacturing a nitride based light emitting diode using the same.

2. Description of the Related Art

Generally, a gallium nitride single crystal is manufactured on a substrate made of a material differing from the gallium nitride single-crystal by vapor growth, such as metal organic chemical vapor deposition (MOCVD) or hydride vapor phase epitaxy (HVPE), or molecular beam epitaxy (MBE).

Here, a sapphire ($\alpha$-$Al_2O_3$) substrate or a SiC substrate is used as the above substrate. The substrate may be cracked by a difference of lattice constants between the substrate and the gallium nitride single crystal and a difference of thermal expansion coefficients between the substrate and the gallium nitride single crystal. For example, since a difference of lattice constants between sapphire and gallium nitride is approximately 13% and a difference of thermal expansion coefficients between sapphire and gallium nitride is −34%, stress is applied on an interface between the sapphire substrate and the gallium nitride single crystal. Since a temperature at which a nitride layer is grown on the substrate is high, the thermal stress caused by a high difference of thermal expansion coefficients therebetween generates the cracks of the substrate and the gallium nitride single crystal.

In order to solve the above problem, two methods have been proposed. One method is that a nitride single crystal is manufactured on a substrate made of a nitride based material using a freestanding nitride based single crystal substrate, and the other method is that a nitride based light emitting structure is separated from a substrate made of a material differing from the nitride single crystal. Here, the freestanding nitride based single crystal substrate is obtained by forming a nitride single crystal on a substrate made of a material differing from the nitride single crystal and then separating the nitride single crystal from the substrate. Accordingly, the above two methods require a technique for separating the nitride single crystal (or the nitride based light emitting structure) from the substrate made of a material differing from nitride.

A laser lift off process is conventionally used to separate the nitride single crystal from the substrate. In the laser lift off process, as shown in FIG. 1, a laser beam is irradiated so that a GaN based single crystal bulk 15 is separated from a sapphire substrate 11 by decomposing the GaN based single crystal bulk 15, located on an interface between the sapphire substrate 11 and the GaN based single crystal bulk 15, into gallium (Ga) and nitride ($\frac{1}{2}N_2$).

However, when a crystal having a diameter of 2 inches or more or a designated thickness or more is grown on the substrate, the laser lift off process causes severe warpage and cracks (C) of the substrate and the crystal due to a difference of lattice constants therebetween and a difference of thermal expansion coefficients therebetween.

Another conventional technique is that ZnO is used as a buffer layer for growing a nitride crystal. Since a difference of lattice constants between a ZnO single crystal oriented along the c-axis and GaN is only 2% and the ZnO single crystal has a wurzite structure the same as that of GaN, the ZnO single crystal facilitates the growth of a nitride crystal and is eliminated by conventional wet etching, thus being advantageously used in separation of the nitride crystal from the substrate. However, since the ZnO single crystal is thermally and chemically unstable and is easily decomposed even at a relatively low temperature (approximately 500° C.), there is a limit to substantially apply the ZnO single crystal to a step of growing the nitride single crystal performed at a high temperature.

SUMMARY OF THE INVENTION

Therefore, the present invention has been made in view of the above problems, and it is an object of the present invention to provide a method for manufacturing a nitride based single crystal substrate, in which a low-temperature nitride buffer layer is formed under the condition that a ZnO single crystal layer is not decomposed so that a high-quality crystal based on the ZnO single crystal layer is grown, and a method for manufacturing a nitride based light emitting diode using the same.

It is another object of the present invention to provide a method for manufacturing a nitride based single crystal substrate, in which a seed for a nano pattern is formed from a ZnO polycrystalline layer on an additional sacrificial layer and is then used to grow a nitride single crystal, and a method for manufacturing a nitride based light emitting diode using the same.

In accordance with one aspect of the present invention, the above and other objects can be accomplished by the provision of a method for manufacturing a nitride based single crystal substrate comprising: forming a ZnO layer on a base substrate; forming a low-temperature nitride buffer layer on the ZnO layer using dimethyl hydragine (DMHy) as an N source; growing a nitride single crystal on the low-temperature nitride buffer layer; and separating the nitride single crystal from the base substrate by chemically eliminating the ZnO layer.

Preferably, the formation of the low-temperature nitride buffer layer may be performed at a temperature of less than approximately 400° C. so as to sufficiently prevent pyrolysis of the ZnO layer. Such a low temperature is employed by using dimethyl hydragine (DMHy) as the N source.

In this aspect, the base substrate may be made of one selected from the group consisting of sapphire, SiC, and silicon, and the low-temperature nitride buffer layer may satisfy the composition of $Al_xGa_yIn_{1-x-y}N$ (Here, $0 \leq x \leq 1$ and $0 \leq y \leq 1$).

In accordance with a further aspect of the present invention, there is provided a method for manufacturing a nitride based single crystal substrate comprising: forming a sacrificial layer made of an oxide film or a nitride film on a base substrate; forming a ZnO layer in a polycrystalline state on the sacrificial layer; forming a nano-sized ZnO pattern by partially decomposing the ZnO layer; forming a low-temperature nitride buffer layer using the ZnO pattern as a seed;

growing a nitride single crystal on the low-temperature nitride buffer layer; and separating the nitride single crystal from the base substrate by chemically eliminating the sacrificial layer.

In this aspect, the base substrate may be made of one selected from the group consisting of sapphire, SiC, and silicon, and the low-temperature nitride buffer layer may satisfy the composition of $Al_xGa_yIn_{1-x-y}N$ (Here, $0 \leq x \leq 1$ and $0 \leq y \leq 1$).

Preferably, the formation of the nano-sized ZnO pattern is performed by pyrolysis performed at a temperature at which the low-temperature nitride buffer layer is grown, and the formation of the low-temperature nitride buffer layer may be performed at a temperature of 400~700° C.

Further, preferably, in the separation of the nitride single crystal from the base substrate, the ZnO pattern may be eliminated together with the elimination of the sacrificial layer so that the surface of the nitride single crystal, from which the ZnO pattern is separated, has an uneven pattern.

In accordance with another aspect of the present invention, there is provided a method for manufacturing a nitride based light emitting diode, particularly a vertical-structured light emitting diode.

The method comprises forming a ZnO layer on a base substrate; forming a first conductivity type low-temperature nitride buffer layer on the ZnO layer using dimethyl hydragine (DMHy) as an N source; forming a light emitting structure including a first conductivity type nitride layer, an active layer, and a second conductivity type layer on the low-temperature nitride buffer layer; and separating the light emitting structure from the base substrate by chemically eliminating the ZnO layer.

Preferably, the formation of the low-temperature nitride buffer layer may be performed at a temperature of less than approximately 400° C.

In accordance with yet another aspect of the present invention, there is provided a method for manufacturing a nitride based light emitting diode comprising: forming a sacrificial layer made of an oxide film or a nitride film on a base substrate; forming a ZnO layer in a polycrystalline state on the sacrificial layer; forming a nano-sized ZnO pattern by partially decomposing the ZnO layer; forming a first conductivity type low-temperature nitride buffer layer using the ZnO pattern as a seed; forming a light emitting structure including a first conductivity type nitride layer, an active layer, and a second conductivity type nitride layer on the low-temperature nitride buffer layer; and separating the light emitting structure from the base substrate by chemically eliminating the sacrificial layer.

In this aspect, in the separation of the nitride single crystal from the base substrate, the ZnO pattern is eliminated together with the elimination of the sacrificial layer so that the surface of the nitride single crystal, from which the ZnO pattern is separated, has an uneven pattern. The uneven pattern greatly improves the light-extracting efficiency of the light emitting diode.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

FIGS. 2A to 2D are sectional views illustrating a method for manufacturing a nitride based single crystal substrate in accordance with one embodiment of the present invention.

Figure 1:
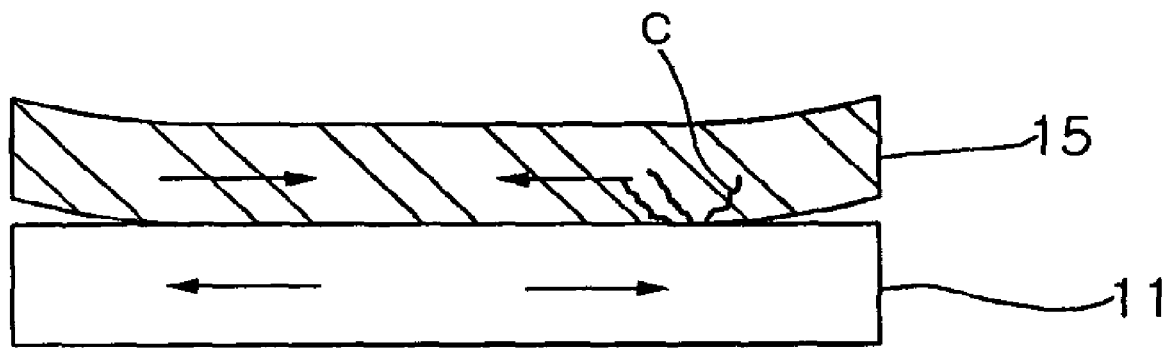
FIG. 1 is a sectional view illustrating the conventional separation of a GaN based single crystal bulk from a sapphire substrate using a laser beam.
Figure 2:
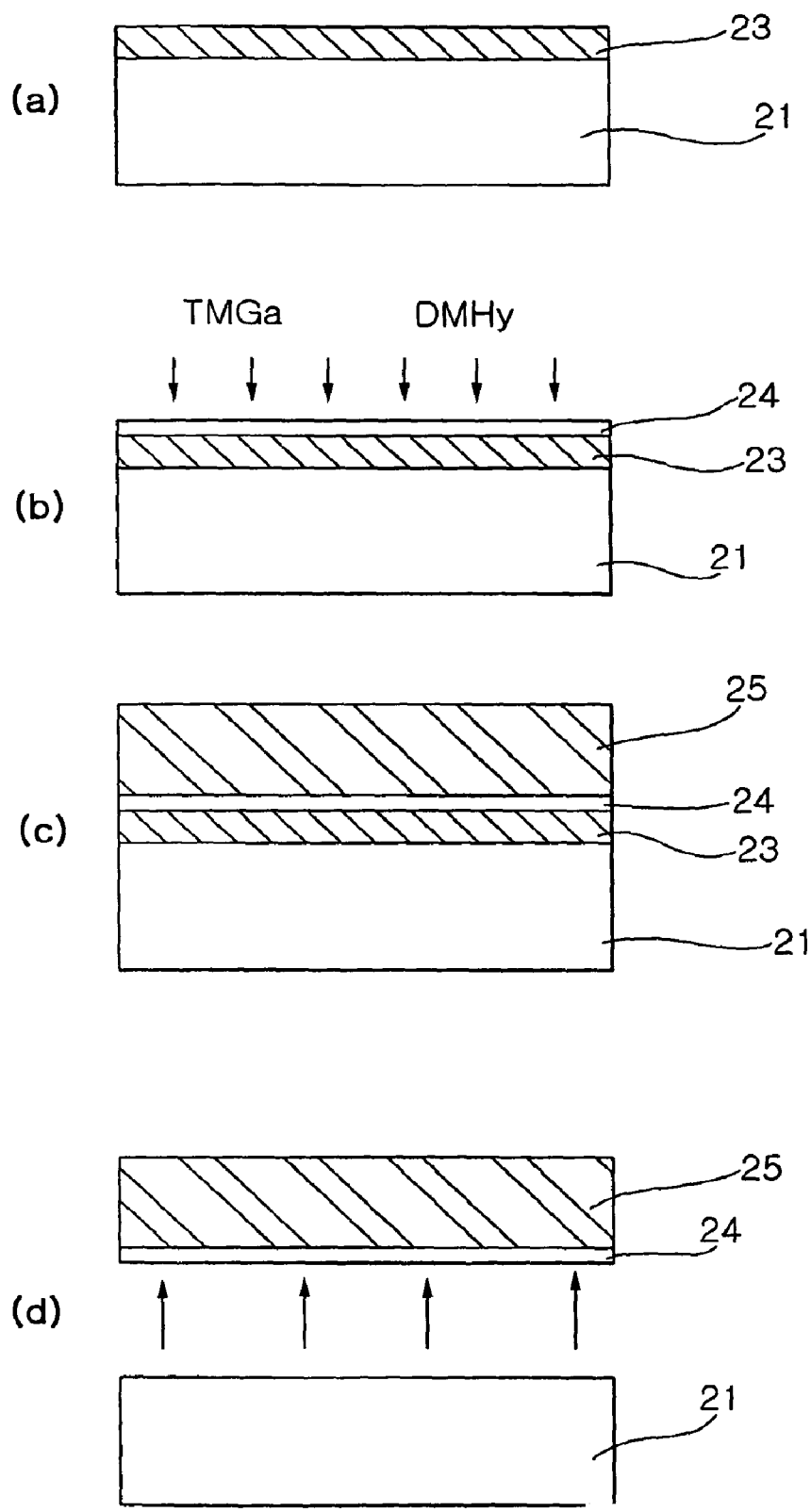
FIGS. 2A to 2D are sectional views illustrating a method for manufacturing a nitride based single crystal substrate in accordance with one embodiment of the present invention.

As shown in FIG. 2A, the method in accordance with this embodiment begins with formation of a ZnO layer 23 on a base substrate 21. Although a sapphire substrate is mainly used as the base substrate 21, a SiC substrate or a silicon substrate may be used as the base substrate 21. The ZnO layer 23 is formed on the base substrate 21, such as a sapphire substrate, by a publicly-known deposition process, such as sputtering. Preferably, the ZnO layer 23 is a layer made of a ZnO single crystal oriented along the c-axis. A difference of lattice constants between the ZnO layer 23 and a nitride single crystal is smaller than a difference of lattice constants between the sapphire substrate and the nitride single crystal, and the ZnO layer 23 has the same wurzite structure as that of the nitride single crystal. Accordingly, the ZnO layer 23 facilitates growth of a high-quality nitride crystal thereon. However, in the present invention, since a low-temperature nitride buffer layer (24 of FIG. 2B) is provided on the ZnO layer 23, the ZnO layer 23 may not require complete single crystal.

Thereafter, as shown in FIG. 2B, the low-temperature nitride buffer layer 24 is formed on the ZnO layer 23 using dimethyl hydragine (DMHy) ($N_2H_2(CH_3)_2$) as an N source. The low-temperature nitride buffer layer 24 satisfies the composition of $Al_xGa_yIn_{1-x-y}N$ (Here, $0 \leq x \leq 1$ and $0 \leq y \leq 1$). When such a low-temperature nitride buffer layer 24 is formed, Trimethyl aluminum (TMAl), trimethyl gallium (TMGa), and trimethyl indium (TMIn) are respectively used as Al, Ga, and In sources. For example, TMGa is decomposed even at a temperature of 300° C., thus being used under the condition that the ZnO layer 23 is not decomposed. Here, since ammonia ($NH_3$) used as the N source has high binding energy, the low-temperature nitride buffer layer 24 requires a growth temperature of at least 500° C. However, the ZnO layer 23 is easily decomposed at the above growth temperature. In order to solve such a problem, dimethyl hydragine (DMHy) is used as the N source for growing the low-temperature nitride buffer layer 24. When dimethyl hydragine (DMHy) is used as the N source, the low-temperature nitride buffer layer 24 is formed at a temperature of less than 400° C., and it is possible to prevent pyrolysis of the ZnO layer 23 during the formation of the low-temperature nitride buffer layer 24.

Thereafter, as shown in FIG. 2C, a nitride single crystal 25 is grown on the low-temperature nitride buffer layer 24. Since the low-temperature nitride buffer layer 24 is formed on the ZnO layer 23 having a difference of lattice constants lower than that of the sapphire substrate (particularly, when the ZnO layer 23 is made of a single crystal), the low-temperature nitride buffer layer 24 has a higher quality than that of a buffer layer directly formed on the sapphire substrate. Accordingly, the nitride single crystal 25 grown at a high temperature has more improved crystallinity. Although the ZnO layer 23 is partially decomposed under high-temperature conditions, since the nitride single crystal 25 is formed on the low-temperature nitride buffer layer 24, the decomposition of the ZnO layer 23 does not affect the growth of the nitride single crystal 25.

Finally, as shown in FIG. 2D, the nitride single crystal 25 is separated from the base substrate 21 by chemically eliminating the ZnO layer 23. Since ZnO is chemically unstable as described above, the ZnO layer 23 may be easily eliminated by a conventional chemical step, such as wet etching. Through the elimination of the ZnO layer 23, the desired nitride single crystal 25 can be separated from the base substrate 21. Such a separation step using the wet etching is easily applied to a mass-production process compared to the conventional laser lift off step, and is applicable to a wafer having a large diameter. The obtained nitride single crystal 25 is used as a freestanding nitride based single crystal substrate.

In the method for manufacturing the nitride based single crystal substrate of the present invention, a vertically-structured nitride based light emitting diode is manufactured by dividing the step of forming the nitride single crystal 25 into sub-steps of forming a first conductivity-type nitride layer, an active layer, and a second conductivity type nitride layer. In this case, since the nitride buffer layer 24 remains on the lower surface of the finally obtained nitride single crystal 25, in order to manufacture the vertically-structured nitride based light emitting diode, the nitride buffer layer 24 is doped with a first conductivity type impurity.

The above embodiment provides a method for manufacturing a nitride based single crystal substrate using the ZnO layer 23 as a sacrificial layer for the separation step. Differently from this embodiment, another embodiment of the present invention provides a method for manufacturing a nitride based single crystal substrate, which uses another or an additional sacrificial layer made of an oxide film or a nitride film, and partially decomposes a ZnO layer made of a polycrystal to form a seed for growing a nitride single crystal.

FIGS. 3A to 3F are sectional views illustrating a method for manufacturing a nitride based single crystal substrate in accordance with another embodiment of the present invention.

Figure 3:
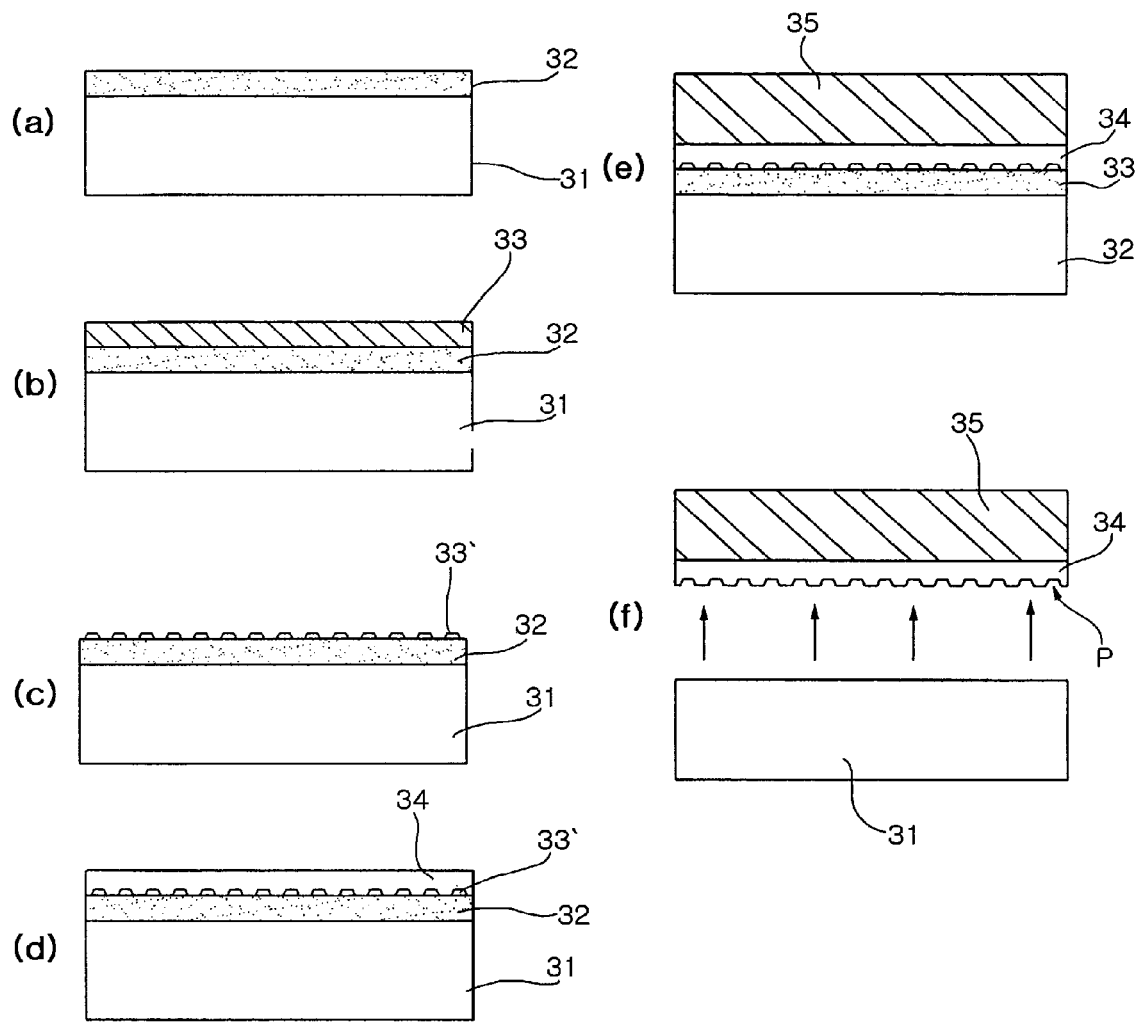
FIGS. 3A to 3F are sectional views illustrating a method for manufacturing a nitride based single crystal substrate in accordance with another embodiment of the present invention.

As shown in FIG. 3A, a sacrificial layer 32, such as an oxide film or a nitride film, is formed on a base substrate 31. Although a sapphire substrate is mainly used as the base substrate 31, a SiC substrate or a silicon substrate may be used as the base substrate 31. The sacrificial layer 32 is made of $SiO_2$ or $SiN_x$, but is not limited thereto so long as the sacrificial layer 32 is made of amorphous material which is easily etched.

Thereafter, as shown in FIG. 3B, a ZnO layer 33 made of a polycrystal is formed on the sacrificial layer 32. The ZnO layer 33 is formed on the base substrate 31, such as the sapphire substrate, by a publicly-known deposition step, such as sputtering. Here, since the sacrificial layer 32 is amorphous, the ZnO layer 33 is not grown in a single crystal state, but is grown in a polycrystalline state.

As shown in FIG. 3C, the ZnO layer 33 is partially decomposed so that a nano-sized ZnO pattern 33' is formed. The above partial decomposition of the ZnO layer 33 is achieved by a thermal or chemical method. Preferably, the partial decomposition of the ZnO layer 33 is continuously performed in a chamber by applying a temperature at which the ZnO layer 33 is decomposable in a subsequent step of forming a nitride buffer layer. The nano-sized ZnO pattern 33' obtained by the above decomposition is irregular, and serves as a seed when a low-temperature nitride buffer layer (34 of FIG. 3D) is grown.

Thereafter, as shown in FIG. 3D, the low-temperature nitride buffer layer 34 is formed using the ZnO pattern 33'. The low-temperature nitride buffer layer 34 may be made of the same material as that of the low-temperature nitride buffer layer 24 of the preceding embodiment, which satisfies the composition of $Al_xGa_yIn_{1-x-y}N$ (Here, $0 \leq x \leq 1$ and $0 \leq y \leq 1$). In the case that the nano-sized ZnO pattern 33' is formed by pyrolysis in this embodiment, the formation of the low-temperature nitride buffer layer 34 is performed at a temperature of at least 400° C., thus not requiring any additional step of forming the seed. In order to perform the above pyrolysis, preferably, the formation of the low-temperature nitride buffer layer 34 is performed at a temperature of 400~700° C.

Then, as shown in FIG. 3E, a nitride single crystal 35 is grown on the low-temperature nitride buffer layer 34. Although high-temperature conditions are applied to this step, since the low-temperature nitride buffer layer 34 is formed on the ZnO pattern 33', the high-temperature conditions do not affect the ZnO pattern 33'.

Finally, as shown in FIG. 3F, the nitride single crystal 35 is separated from the base substrate 31 by chemically eliminating the sacrificial layer 32. The elimination of the sacrificial layer 32 is easily achieved by wet etching. Here, preferably, the ZnO pattern 33' is eliminated together with the elimination of the sacrificial layer 32. Since ZnO is chemically unstable, the ZnO pattern 33, is easily eliminated together with the elimination of the sacrificial layer 32. The obtained nitride single crystal 35 is used as a freestanding nitride based single crystal substrate.

This embodiment is beneficially applied to the manufacture of a vertically-structured nitride based light emitting diode. Particularly, the surface of the obtained nitride single crystal 35, from which the ZnO pattern 33' serving as the seed is separated, has an irregularly uneven pattern (P), thus greatly improving light-extracting efficiency.

Figure 4:
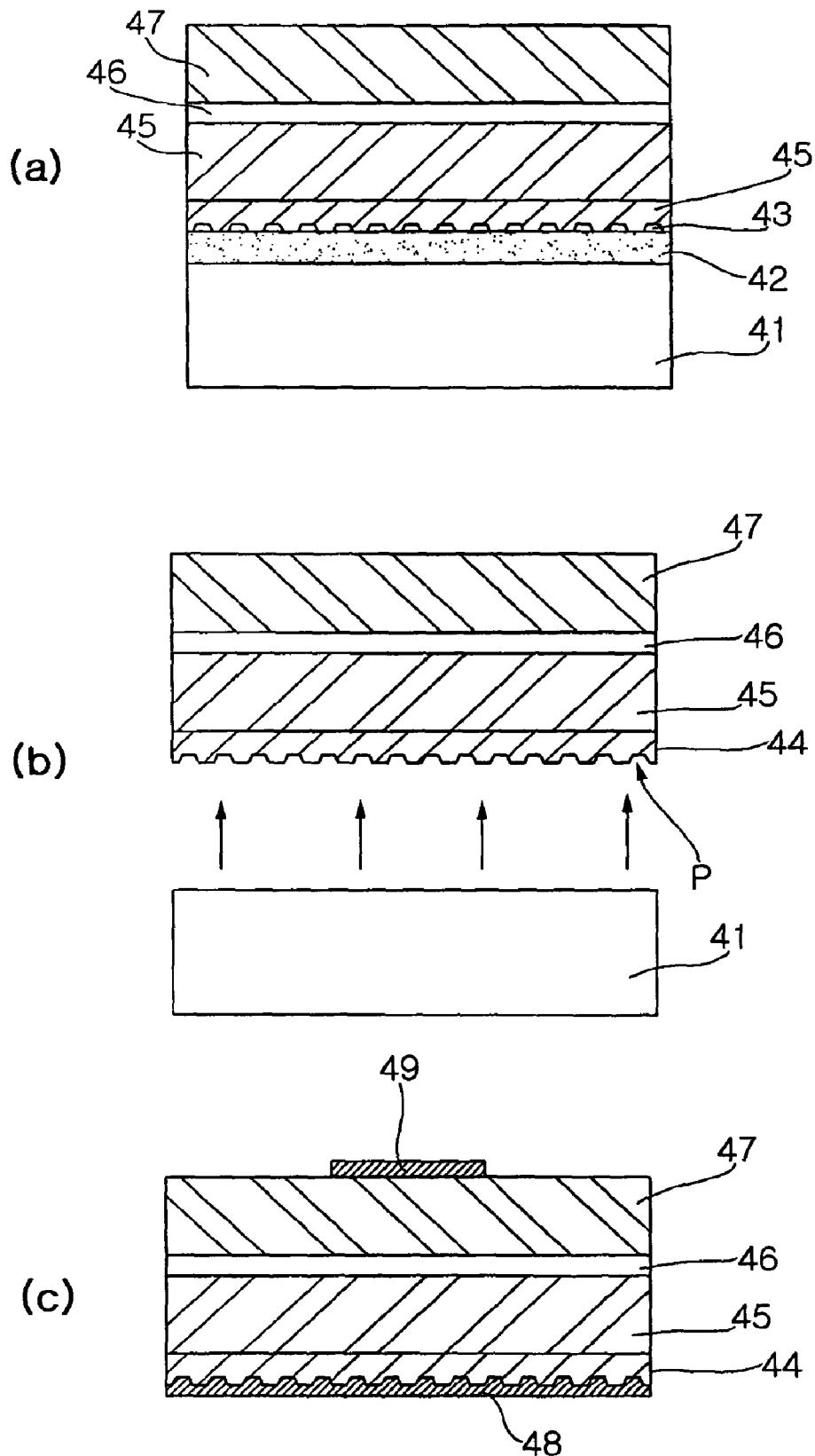
FIGS. 4A to 4C are sectional views illustrating a method for manufacturing a nitride based light emitting diode of the present invention.

FIGS. 4A to 4C are sectional views illustrating a method for manufacturing a nitride based light emitting diode of the present invention. This method uses the method for manufacturing the nitride based single crystal substrate as shown in FIGS. 3A to 3F.

FIG. 4A illustrates a base substrate 41, on which a sacrificial layer 42 made of an oxide film or a nitride film, a nano-sized ZnO pattern 43, a first conductivity type nitride buffer layer 44, and a light emitting structure are sequentially formed. Here, the light emitting structure includes a first conductivity type nitride layer 45, an active layer 46, and a second conductivity type nitride layer 47. In this method, a process for obtaining the structure of the base substrate 41 shown in FIG. 4A is omitted, but the process shown in FIGS. 3A to 3C is used. However, in this method, in order to obtain a vertically-structured light emitting diode, a nitride buffer layer 44, which is doped with a first conductivity type impurity, is formed.

Thereafter, as shown in FIG. 4B, the light emitting structure is separated from the base substrate 41 by chemically eliminating the sacrificial layer 42. The low-temperature nitride buffer layer 44 is formed on the lower surface of the separated light emitting structure. Here, the ZnO pattern, 43 is eliminated together with the elimination of the sacrificial layer 42, and the surface of the obtained light emitting structure, from which the ZnO pattern 43 is separated, has an irregularly uneven pattern (P). The uneven pattern (P) formed on the surface of the light emitting structure reduces a critical angle at which light is extracted, thereby greatly improving light-extracting efficiency. The present invention is advantageous in that the uneven pattern (P) is easily obtained by the nitride growth step and the nitride separation step without any additional pattern formation step.

Finally, as shown in FIG. 4C, a first electrode 48 and a second electrode 49 are respectively formed on upper and lower surfaces of the obtained light emitting structure, thereby completing the manufacture of a desired vertically-structured light emitting diode. The vertically-structured light emitting diode has an improved current distribution effect, compared to a light emitting diode, in which two electrodes 48 and 49 are formed on the upper surface thereof, thus having high efficiency in emitting light. The above vertically-structured light emitting diode is easily obtained by the formation of the ZnO pattern 43 and the elimination of the ZnO pattern 43.

As apparent from the above description, the present invention provides a method for manufacturing a high-quality nitride based single crystal substrate, which uses a ZnO layer as a sacrificial layer or uses an additional sacrificial layer and a nano-sized ZnO pattern under the condition that the decomposition of ZnO is prevented during the growth of nitride, and easily performs the separation of the nitride from the base substrate. Further, the present invention provides a method for manufacturing a vertically-structured light emitting diode having improved light-extracting efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a nitride based single crystal substrate comprising:
    forming a sacrificial layer made of an oxide film or a nitride film on a base substrate;
    forming a ZnO layer in a polycrystalline state on the sacrificial layer;
    forming a nano-sized ZnO pattern by partially decomposing the ZnO layer;
    forming a low-temperature nitride buffer layer using the ZnO pattern as a seed; and
    growing a nitride single crystal on the low-temperature nitride buffer layer,
    wherein the formation of the nano-sized ZnO pattern is performed by pyrolysis performed at a temperature at which the low-temperature nitride buffer layer is grown.

2. The method as set forth in claim 1, wherein the base substrate is made of one selected from the group consisting of sapphire, SiC, and silicon.

3. The method as set forth in claim 1, wherein the low-temperature nitride buffer layer satisfies the composition of $Al_xGa_yIn_{1-x-y}N$ (Here, $0 \leq x \leq 1$ and $0 \leq y \leq 1$).

4. The method as set forth in claim 1, wherein the formation of the low-temperature nitride buffer layer is performed at a temperature of 400~700° C.

5. A method for manufacturing a nitride based single crystal substrate comprising: forming a sacrificial layer made of an oxide film or a nitride film on a base substrate; forming a ZnO layer in a polycrystalline state on the sacrificial layer; forming a nano-sized ZnO pattern by partially decomposing the ZnO layer; forming a low-temperature nitride buffer layer using the ZnO pattern as a seed; growing a nitride single crystal on the low-temperature nitride buffer layer; and separating the nitride single crystal from the base substrate by chemically eliminating the sacrificial layer, wherein, in the separation of the nitride single crystal from the base substrate, the ZnO pattern is eliminated together with the elimination of the sacrificial layer so that the surface of the low-temperature nitride buffer layer, from which the ZnO pattern is separated, has an uneven pattern.

6. A method for manufacturing a nitride based light emitting diode comprising:
    forming a sacrificial layer made of an oxide film or a nitride film on a base substrate;
    forming a ZnO layer in a polycrystalline state on the sacrificial layer;
    forming a nano-sized ZnO pattern by partially decomposing the ZnO layer;
    forming a first conductivity type low-temperature nitride buffer layer using the ZnO pattern as a seed; and
    forming a light emitting structure including a first conductivity type nitride layer, an active layer, and a second conductivity type nitride layer on the low-temperature nitride buffer layer,
    wherein the formation of the nano-sized ZnO pattern is performed by pyrolysis performed at a temperature at which the low-temperature nitride buffer layer is grown.

7. The method as set forth in claim 6, wherein the base substrate is made of one selected from the group consisting of sapphire, SiC, and silicon.

8. The method as set forth in claim 6, wherein the low-temperature nitride buffer layer satisfies the composition of $Al_xGa_yIn_{1-x-y}N$ (Here, $0 \leq x \leq 1$ and $0 \leq y \leq 1$).

9. The method as set forth in claim 6, wherein the formation of the low-temperature nitride buffer layer is performed at a temperature of 400~700° C.

10. A method for manufacturing a nitride based light emitting diode comprising: forming a sacrificial layer made of an oxide film or a nitride film on a base substrate; forming a ZnO layer in a polycrystalline state on the sacrificial layer; forming a nano-sized ZnO pattern by partially decomposing the ZnO layer; forming a first conductivity type low-temperature nitride buffer layer using the ZnO pattern as a seed; forming a light emitting structure including a first conductivity type nitride layer, an active layer, and a second conductivity type nitride layer on the low-temperature nitride buffer layer; and separating the nitride single crystal from the base substrate by chemically eliminating the sacrificial layer, wherein, in the separation of the nitride single crystal from the base substrate, the ZnO pattern is eliminated together with the elimination of the sacrificial layer so that the surface of the first conductivity type low-temperature nitride buffer layer, from which the ZnO pattern is separated, has an uneven pattern.

11. The method as set forth in claim 1, further comprising separating the nitride single crystal from the base substrate by chemically eliminating the sacrificial layer.

12. The method as set forth in claim 6, further comprising separating the nitride emitting structure from the base substrate by chemically eliminating the sacrificial layer.

* * * * *